United States Patent
Lee et al.

(10) Patent No.: US 9,379,325 B2
(45) Date of Patent: Jun. 28, 2016

(54) DONOR MASK AND METHOD OF MANUFACTURING ORGANIC LIGHT EMITTING DISPLAY APPARATUS USING THE SAME

(71) Applicant: SAMSUNG DISPLAY CO., LTD., Yongin, Gyeonggi-Do (KR)

(72) Inventors: Joongu Lee, Yongin (KR); Yeonhwa Lee, Yongin (KR); Jinbaek Choi, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/631,051

(22) Filed: Feb. 25, 2015

(65) Prior Publication Data
US 2016/0072066 A1    Mar. 10, 2016

(30) Foreign Application Priority Data
Sep. 5, 2014   (KR) ........................ 10-2014-0119379

(51) Int. Cl.
| | |
|---|---|
| H01L 51/56 | (2006.01) |
| H01L 27/32 | (2006.01) |
| H01L 51/00 | (2006.01) |
| H01L 51/50 | (2006.01) |

(52) U.S. Cl.
CPC ........ *H01L 51/0013* (2013.01); *H01L 27/3211* (2013.01); *H01L 51/56* (2013.01); *H01L 51/5012* (2013.01)

(58) Field of Classification Search
CPC ........................ H01L 51/0013; H01L 27/3211
USPC .......................................................... 438/35
See application file for complete search history.

(56) References Cited

U.S. PATENT DOCUMENTS

| | | | |
|---|---|---|---|
| 8,093,612 B2 | 1/2012 | Tanaka | |
| 2005/0136344 A1* | 6/2005 | Kang | B41M 5/42 430/18 |
| 2006/0051533 A1* | 3/2006 | Song | B41M 5/385 428/32.81 |
| 2009/0075214 A1 | 3/2009 | Hirakata et al. | |
| 2009/0104835 A1* | 4/2009 | Aoyama | H01L 51/0013 445/58 |
| 2009/0134787 A1 | 5/2009 | Matsuo | |
| 2009/0166563 A1* | 7/2009 | Yokoyama | C23C 14/048 250/492.1 |
| 2009/0169809 A1* | 7/2009 | Yokoyama | H01L 51/0013 428/138 |
| 2009/0197017 A1* | 8/2009 | Tanaka | H01L 51/0013 427/596 |
| 2010/0084676 A1* | 4/2010 | Tanaka | H01L 51/0013 257/98 |
| 2012/0086330 A1* | 4/2012 | Umeda | H01L 51/0013 313/504 |
| 2014/0038349 A1* | 2/2014 | Kang | H01L 51/0013 438/99 |

FOREIGN PATENT DOCUMENTS

| | | |
|---|---|---|
| JP | 2007-281159 A | 10/2007 |
| KR | 10-2009-0028413 A | 3/2009 |
| KR | 10-2010-0136728 A | 12/2010 |

\* cited by examiner

*Primary Examiner* — Moazzam Hossain
(74) *Attorney, Agent, or Firm* — Lee & Morse, P.C.

(57) ABSTRACT

A donor mask includes a base substrate, a light-to-heat conversion layer disposed on the base substrate and including a first upper surface portion and a second upper surface portion, and a reflection layer interposed between the base substrate and the light-to-heat conversion layer and including through holes corresponding to the first upper surface portion and the second upper surface portion. The first upper surface portion includes a first upper surface and a second upper surface connected to the first upper surface and inclined at an angle other than 90 degrees with respect to the first upper surface.

11 Claims, 9 Drawing Sheets

DONOR MASK AND METHOD OF MANUFACTURING ORGANIC LIGHT EMITTING DISPLAY APPARATUS USING THE SAME

CROSS-REFERENCE TO RELATED APPLICATION

Korean Patent Application No. 10-2014-0119379, filed on Sep. 5, 2014, in the Korean Intellectual Property Office, and entitled: "Donor Mask and Method of Manufacturing Organic Light Emitting Display Apparatus by Using the Same," is incorporated by reference herein in its entirety.

BACKGROUND

1. Field

One or more embodiments relate to a donor mask and a method of manufacturing an organic light emitting display apparatus using the same, and more particularly, to a donor mask for use in the manufacturing process of an organic light emitting display apparatus and a method of manufacturing an organic light emitting display apparatus using the donor mask.

2. Description of the Related Art

An organic light emitting display apparatus is a display apparatus including an organic-light emitting diode (OLED) in a display region, wherein the OLED includes a pixel electrode and an opposing electrode that face each other, and an intermediate layer disposed between the pixel and opposing electrodes and including an emission layer. Some of a plurality of layers included in the intermediate layer need to be formed in units of sub-pixels and thus are formed according to separate processes.

However, in a conventional method of manufacturing an organic light-emitting display apparatus, an intermediate layer is manufactured through many processes, and thus much time is taken to manufacture the intermediate layer and manufacturing efficiency is reduced.

SUMMARY

According to one or more embodiments, a donor mask includes a base substrate; a light-to-heat conversion layer on the base substrate and including a first upper surface portion and a second upper surface portion, the first upper surface portion including a first upper surface and a second upper surface, the second upper surface being connected to the first upper surface and inclined at an angle other than 90 degrees with respect to the first upper surface; and a reflection layer between the base substrate and the light-to-heat conversion layer, the reflection layer including through holes corresponding to the first upper surface portion and the second upper surface portion.

The second upper surface portion may have an upper surface that is parallel to the first upper surface.

A lower surface portion of the light-to-heat conversion layer that corresponds to the first upper surface portion of the light-to-heat conversion layer may be on the same plane as a lower surface portion of the light-to-heat conversion layer that corresponds to the second upper surface portion of the light-to-heat conversion layer.

The light-to-heat conversion layer may have a first concave portion and a second concave portion, the first upper surface portion may be placed in the first concave portion, and the second upper surface portion may be placed in the second concave portion. The first upper surface may be a lower surface of the first concave portion, the second upper surface may be a lateral surface of the first concave portion, the second upper surface portion may have an upper surface that is a lower surface of the second concave portion, and a lateral surface of the second concave portion may be perpendicular to the lower surface of the second concave portion.

The donor mask may further include an insulation layer that is interposed between the reflection layer and the light-to-heat conversion layer and that includes a first concave portion having a lower surface and a lateral surface inclined at an angle other than 90 degrees with respect to the lower surface. The light-to-heat conversion layer may include a first light-to-heat conversion layer placed within the first concave portion and a second light-to-heat conversion layer placed outside the first concave portion. The first light-to-heat conversion layer may include a first upper surface portion, the first upper surface may be positioned at the lower surface of the first concave portion, the second upper surface may be positioned at the lateral surface of the first concave portion, and the second light-to-heat conversion layer may include a second upper surface portion.

In this case, the insulation layer may further include a second concave portion separated from the first concave portion and including a lower surface and a lateral surface perpendicular to the lower surface. The second light-to-heat conversion layer may be placed within the second concave portion, and an upper surface of the second upper surface portion may be positioned at the lower surface of the second concave portion. The insulation layer may further include a protrusion positioned between the first concave portion and the second concave portion.

The donor mask may further include a transfer layer formed on the light-to-heat conversion layer.

According to one or more embodiments, a method of manufacturing an organic light-emitting display apparatus includes preparing a substrate on which a plurality of pixel electrodes are formed; preparing a donor mask, the donor mask including: a base substrate; a light-to-heat conversion layer disposed on the base substrate and including a first upper surface portion and a second upper surface portion, the first upper surface portion including a first upper surface and a second upper surface, the second upper surface being connected to the first upper surface and inclined at an angle other than 90 degrees with respect to the first upper surface; and a reflection layer interposed between the base substrate and the light-to-heat conversion layer, the reflection layer including through holes corresponding to the first upper surface portion and the second upper surface portion; forming a transfer layer on the light-to-heat conversion layer of the donor mask via deposition; aligning the substrate with the donor mask; and transferring portions of the transfer layer of the donor mask that correspond to the through holes onto the plurality of pixel electrodes formed on the substrate.

Transferring may include transferring a portion of the transfer layer on the first upper surface portion onto pixel electrodes of first color pixels formed on the substrate and transferring a portion of the transfer layer on the second upper surface portion onto pixel electrodes of second color pixels formed on the substrate.

Transferring may include respectively transferring the portion of the transfer layer on the first upper surface portion and the portion of the transfer layer on the second upper surface portion onto the pixel electrodes of the first color pixels and the pixel electrodes of the second color pixels such that a layer formed on the pixel electrodes of the first color pixels is thicker than a layer formed on the pixel electrodes of the second color pixels.

Transferring may include simultaneously transferring the portion of the transfer layer on the first upper surface portion and the portion of the transfer layer on the second upper surface portion onto the pixel electrodes of the first color pixels and the pixel electrodes of the second color pixels, respectively.

The second upper surface portion may have an upper surface that is parallel to the first upper surface.

A lower surface portion of the light-to-heat conversion layer that corresponds to the first upper surface portion of the light-to-heat conversion layer may be on the same plane as a lower surface portion of the light-to-heat conversion layer that corresponds to the second upper surface portion of the light-to-heat conversion layer.

The light-to-heat conversion layer may have a first concave portion and a second concave portion, the first upper surface portion may be placed in the first concave portion, and the second upper surface portion may be placed in the second concave portion. The first upper surface may be a lower surface of the first concave portion, the second upper surface may be a lateral surface of the first concave portion, the second upper surface portion may have an upper surface that is a lower surface of the second concave portion, and a lateral surface of the second concave portion may be perpendicular to the lower surface of the second concave portion.

The donor mask may further include an insulation layer that is interposed between the reflection layer and the light-to-heat conversion layer and that includes a first concave portion having a lower surface and a lateral surface inclined at an angle other than 90 degrees with respect to the lower surface. The light-to-heat conversion layer may include a first light-to-heat conversion layer placed within the first concave portion and a second light-to-heat conversion layer placed outside the first concave portion. The first light-to-heat conversion layer may include a first upper surface portion, the first upper surface may be positioned at the lower surface of the first concave portion, the second upper surface may be positioned at the lateral surface of the first concave portion, and the second light-to-heat conversion layer may include a second upper surface portion.

The insulation layer may further include a second concave portion separated from the first concave portion and including a lower surface and a lateral surface perpendicular to the lower surface. The second light-to-heat conversion layer may be placed within the second concave portion, and an upper surface of the second upper surface portion may be positioned at the lower surface of the second concave portion. The insulation layer may further include a protrusion positioned between the first concave portion and the second concave portion.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
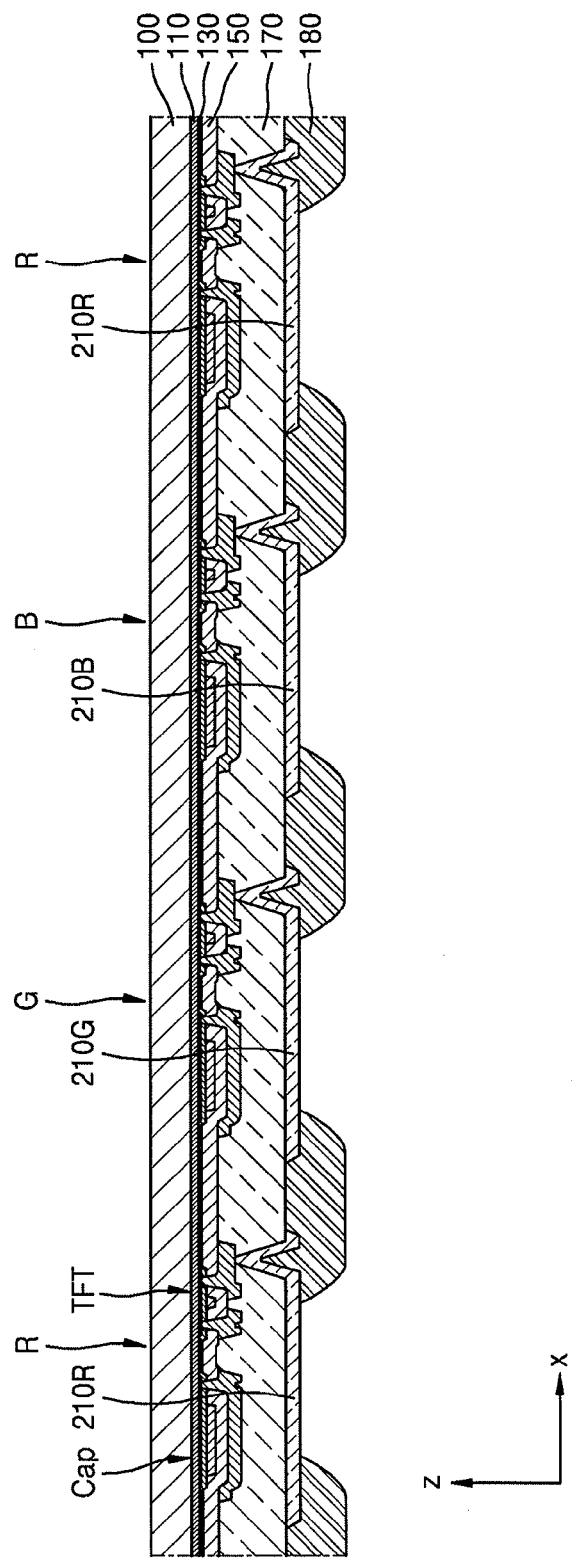
FIGS. 1-4 illustrate cross-sectional views of stages in a method of manufacturing an organic light-emitting display apparatus, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1-4 illustrate cross-sectional views of stages in a method of manufacturing an organic light-emitting display apparatus, according to an embodiment.

First, as shown in FIG. 1, a backplane is prepared. The backplane may be understood as a substrate 100 on which a plurality of pixel electrodes 210R, 210G, and 210B have been formed. As shown in FIG. 1, the backplane may further include a pixel definition layer 180 in addition to the substrate 100 and the pixel electrodes 210R, 210G, and 210B. The pixel definition layer 180 exposes at least a portion of each of the pixel electrodes 210R, 210G, and 210B, and each of the portions includes a center portion. The pixel definition layer 180 may protrude farther than the pixel electrodes 210R, 210G, and 210B with respect to the substrate 100 along the z-direction.

The pixel electrodes 210R, 210G, and 210B may be (semi-)transparent electrodes or reflective electrodes. When the pixel electrodes 210R, 210G, and 210B are (semi-)transparent electrodes, the pixel electrodes 210R, 210G, and 210B may be formed of, e.g., indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210R, 210G, and 210B are reflective electrodes, each of the pixel electrodes 210R, 210G, and 210B may include a reflective layer formed on, e.g., silver (Ag), magnesium (Mg), aluminum (Al), platinum (Pt), palladium (Pd), gold (Au), nickel (Ni), neodymium (Nd), iridium (Ir), chromium (Cr), or a combination thereof, and a layer formed of ITO, IZO, ZnO, or $In_2O_3$. Structures and materials of the pixel electrodes 210R, 210G, and 210B are not limited to those described above, and various modifications may be made to the structures and materials.

The pixel definition layer 180 may include openings corresponding to sub-pixels, namely, openings via which respective central portions or entire portions of the pixel electrodes 210R, 210G, and 210B are exposed, thereby defining pixels or sub-pixels. The pixel-definition layer 180 may also increase a distance between an end of each of the pixel electrodes 210R, 210G, and 210B, and an opposite electrode (not shown) formed on each of the pixel electrodes 210R, 210G, and 210B, thereby preventing an arc or the like from occurring at the end of each of the pixel electrodes 210R, 210G, and 210B.

The backplane may further include other components, if required. For example, as shown in FIG. 1, a thin-film transistor TFT or a capacitor Cap may be formed on the substrate 100. The backplane may further include other components, such as a buffer layer 110 preventing impurities from permeating into a semiconductor layer of the thin-film transistor TFT, a gate insulation layer 130 insulating the semiconductor layer of the thin-film transistor TFT from a gate electrode, an interlayer insulation layer 150 insulating source and drain electrodes of the thin-film transistor TFT from the gate electrode, and a planarization layer 170 covering the thin-film transistor TFT and having an approximately flat top surface.

Figure 2:
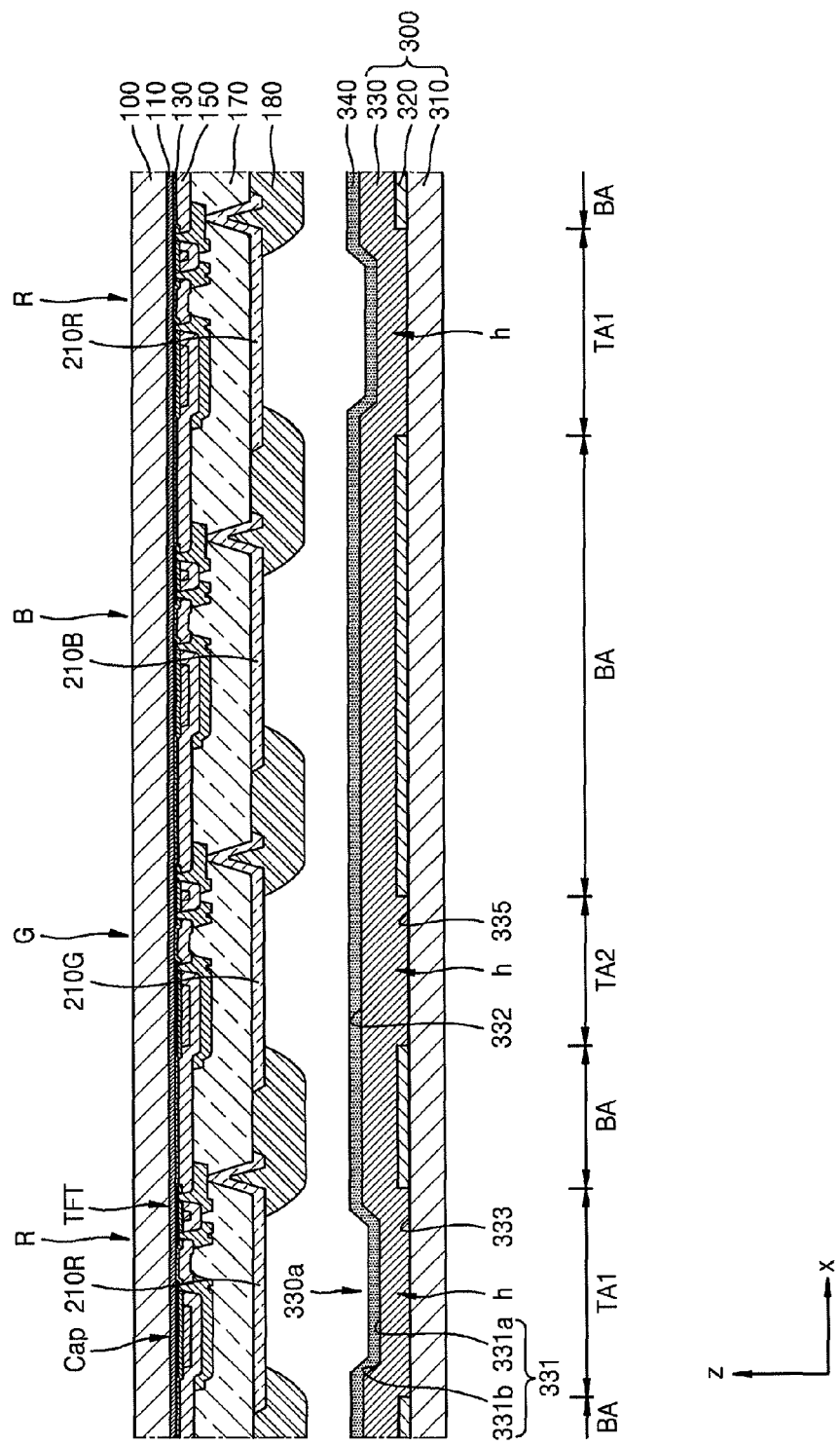

After preparing the backplane as described above, a donor mask 300 is prepared and disposed to face the pixel electrodes 210R, 210G, and 210B, and the pixel definition layer 180 of the backplane as shown in FIG. 2. In detail, as shown in FIG. 2, the pixel electrodes 210R, 210G, and 210B, and the pixel definition layer 180 of the backplane are disposed to face downward (i.e., a −z direction), and the donor mask 300 is disposed under the backplane. Before placing the backplane and the donor mask 300 as described above, a layer, e.g., a hole injection layer and/or a hole transport layer, may be formed on the pixel electrodes 210R, 210G, and 210B, or on an entire surface of the substrate 100. Although a considerable space exists between the donor mask 300 and the backplane in FIG. 2, this only an example for convenience of explanation, and the donor mask 300 and the backplane may be close together, e.g., in contact or adhered to each other.

The donor mask 300 may include a base substrate 310, a reflection layer 320, and a light-to-heat conversion layer 330. After preparing the donor mask 300, a transfer layer 340 is formed on the light-to-heat conversion layer 330, e.g., via deposition. In some cases, the transfer layer 340 may be considered a component of the donor mask 300. In this case, it may be understood that a donor mask 300 including the base substrate 310, the reflection layer 320, the light-to-heat conversion layer 330, and the transfer layer 340 is prepared.

The base substrate 310 forms an overall exterior of the donor mask 300, and may be formed of a transparent material, e.g., glass, in order to transmit light to the light-to-heat conversion layer 330. In some case, the base substrate 310 may be formed of polyester, e.g., polyethylene terephthalate (PET), polyacryl, polyepoxy, polyethylene, and/or polystyrene.

The reflection layer 320 is between the base substrate 310 and the light-to-heat conversion layer 330. The reflection layer 320 has a plurality of through holes h. Thus, the reflection layer 320 has transmittance areas TA1 and TA2 corresponding to the through holes h, and blocking areas BA corresponding to the remaining portions.

The reflection layer 320 may be formed by forming the through holes h on the base substrate 310 by selectively providing a material, e.g., using a mask, or by forming the through holes h by forming a layer having a uniform thickness on the base substrate 310 and then removing a part of the layer. The reflection layer 320 may be formed of Ti, Al, Cu, Ag, Mo, an alloy of these, CrN, TiAlCu, or the like. Alternatively, the reflection layer 320 may be formed of TiOx, SiOx, SiCN, or the like.

The light-to-heat conversion layer 330 is a layer for absorbing flash lamp light or a laser beam when irradiated and converting at least a portion of energy of the absorbed flash lamp light or laser beam to heat. The light-to-heat conversion layer 330 may be a metal layer, e.g., a metal capable of absorbing light in an infrared light-visible light region, e.g., aluminum or silver, an oxide/sulfide layer formed of such a metal, or an organic polymer layer including carbon black or graphite.

The light-to-heat conversion layer 330 has a first upper surface portion 331 and a second upper surface portion 332 as shown in FIG. 2. The second upper surface portion 332 has a flat upper surface, whereas the first upper surface portion 331 has a first upper surface 331a and a second upper surface 331b. The second upper surface 331b is connected to the first upper surface 331a and is inclined at a non-perpendicular angle with respect to the first upper surface 331a. In FIG. 2, the light-to-heat conversion layer 330 includes a first concave portion 330a, and the first upper surface portion 331 is positioned within the first concave portion 330a. In other words, the first upper surface 331a of the first upper surface portion 331 may be understood as a lower surface of the first concave portion 330a, and the second upper surface 331b of the first upper surface portion 331 may be understood as a lateral surface of the first concave portion 330a. In this case, the second upper surface portion 332 may be understood as having an upper surface that is parallel to the first upper surface 331a of the first upper surface portion 331. As shown in FIG. 2, a lower surface portion of the light-to-heat conversion layer 330 corresponding to the first upper surface portion 331 thereof may be on the same plane as a lower surface portion of the light-to-heat conversion layer 330 corresponding to the second upper surface portion 332 thereof.

The transfer layer 340 is a layer that may be evaporated, vaporized, or sublimated by heat generated in the light-to-heat conversion layer 330, and may, for example, include a light-emission material, a hole transport material, or a hole injection material. The transfer layer 340 may be a layer including an electron transport material or a layer including an electron injection material if necessary.

Since the light-to-heat conversion layer 330 includes the first upper surface portion 331 including the first upper surface 331a and the second upper surface 331b inclined with respect to the first upper surface 331a, the transfer layer 340 formed on the light-to-heat conversion layer 330 is formed along the shape of the first upper surface portion 331. In other words, as shown in FIG. 2, the transfer layer 340 is formed on the first upper surface 331a of the first upper surface portion 331 and the second upper surface 331b inclined with respect to the first upper surface 331a to have an approximately uniform thickness.

When the backplane and the donor mask 300 are arranged as shown in FIG. 2, the backplane and the donor mask 300 need to be precisely aligned such that the transmittance areas TA1 and TA2 of the reflection layer 320 correspond to a preset portion of the backplane. Since FIG. 2 corresponds to a case where the transfer layer 340 of the donor mask 300 includes a material that is to be deposited on a red sub-pixel R and a green sub-pixel G of the backplane, the backplane and the donor mask 300 are aligned such that the through holes h of the reflection layer 320 of the donor mask 300 correspond to the pixel electrode 210G of the red sub-pixel R and the pixel electrode 210G of the green sub-pixel G.

Figure 3:
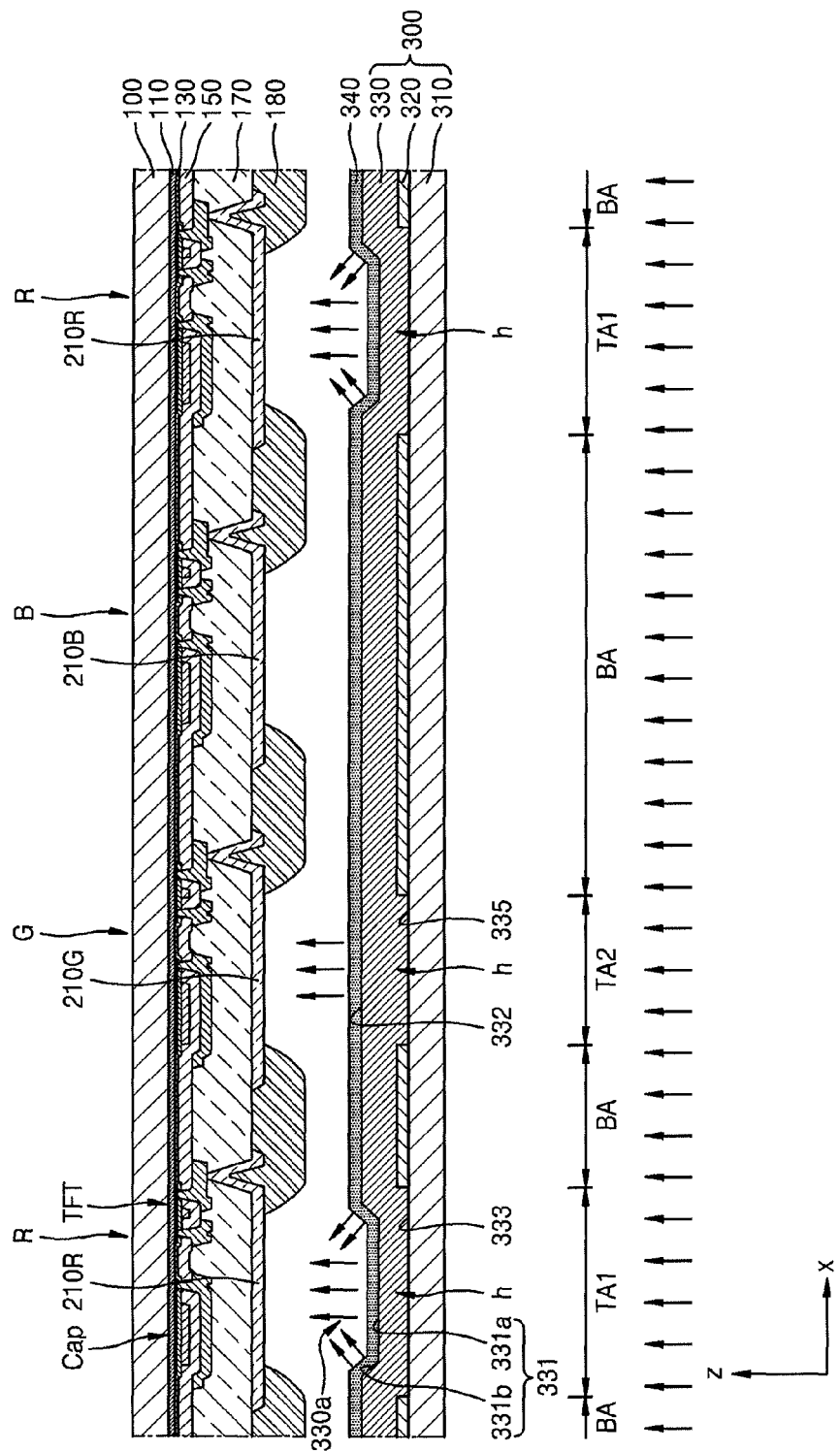
Figure 4:
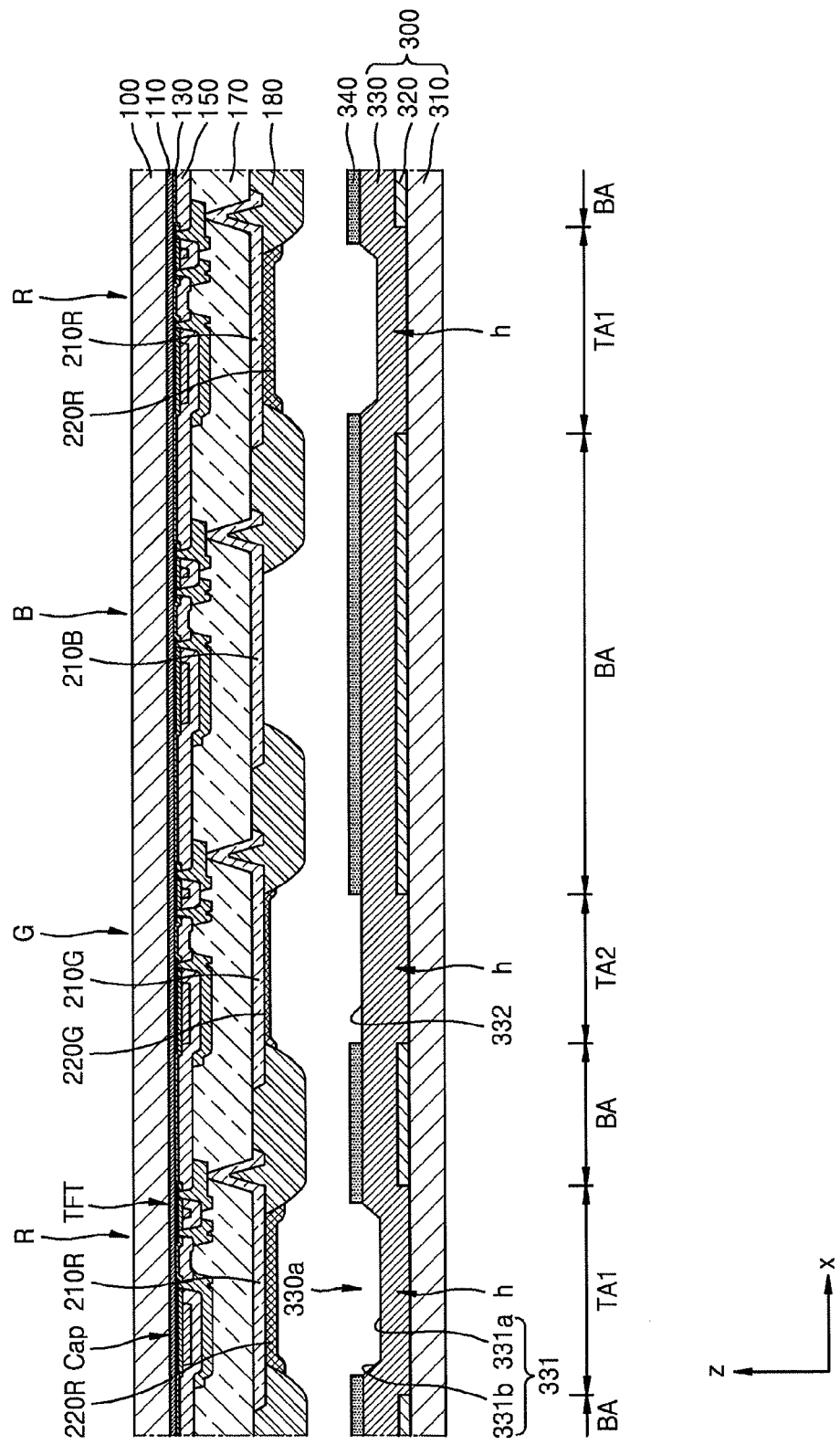

Thereafter, as shown in FIG. 3, lamp light or the laser beam is radiated onto the donor mask 300 using a flash lamp or a laser, and thus a portion of the transfer layer 340 of the donor mask 300 is transferred to the backplane. In this case, although the lamp light or the laser beam is radiated onto the entire surface of the donor mask 300 by using the flash lamp or the laser beam generator, the lamp light or the laser beam is mostly blocked by the reflection layer 320 and only reaches the light-to-heat conversion layer 330 via the through holes h of the reflection layer 320 corresponding to the transmittance areas TA1 and TA2. Accordingly, only portions of the transfer layer 340 of the donor mask 300 that correspond to the transmittance areas TA1 and TA2 are evaporated, vaporized, or sublimated. Thus, layers 220R and 220G are formed only on the pixel electrode 210R of the red sub-pixel R and the pixel electrode 210G of the green sub-pixel G as shown in FIG. 4.

When the first upper surface portion 331 of the light-to-heat conversion layer 330 corresponds to the red sub-pixel R and the second upper surface portion 332 of the light-to-heat conversion layer 330 corresponds to the green sub-pixel G, a portion of the transfer layer 340 on the first upper surface portion 331 and a portion thereof on the second upper surface portion 332 are simultaneously transferred to the pixel electrodes 210R and 210G, respectively. Since the first upper surface portion 331 includes not only the first upper surface 331a but also the second upper surface 331b, portions of the transfer layer 340 on both the first upper surface 331a and the second upper surface 331b are transferred to the pixel electrode 210R of the red sub-pixel R. The portion of the transfer layer 340 on the second upper surface portion 332 is transferred to the pixel electrode 210G of the green sub-pixel G.

In this process, since the first upper surface 331a and a portion of the second upper surface portion 332 corresponding to the green sub-pixel G have approximately identical areas, the layer 220R on the pixel electrode 210R of the red sub-pixel R formed via transferring both portions of the transfer layer 340 respectively on the first upper surface 331a and the second upper surface 331b is thicker than the layer 220G on the pixel electrode 210G of the green sub-pixel G formed via transferring only a portion of the transfer layer 340 on the portion of the second upper surface portion 332 corresponding to the green sub-pixel G. In other words, even when the transfer layer 340 formed of the same material throughout the first upper surface portion and the second upper surface portion on the donor mask 300 is simultaneously transferred onto the pixel electrodes 210R and 210G of the red sub-pixel R and the green sub-pixel G of the backplane, the layer 220R formed on the pixel electrode 210R of the red sub-pixel R may be formed to be thicker than the layer 220G formed on the pixel electrode 210G of the green sub-pixel G. Accordingly, the two layers 220R and 220G having different thicknesses may be simultaneously formed of the same material in an identical process.

In particular, when the transfer layer 340 is evaporated, vaporized, or sublimated by the heat generated in the light-to-heat conversion layer 330 and, thus, transferred to the backplane, the material of the transfer layer 340 is moved in a direction almost perpendicular to the light-to-heat conversion layer 330. In other words, the portion of the transfer layer 340 on the first upper surface 331a is moved in a +z direction, which is approximately perpendicular to the first upper surface 331a, and is transferred to the backplane, and the portion of the transfer layer 340 on the second upper surface 331b is moved in a direction indicated by arrows of FIG. 3, which is approximately perpendicular to the second upper surface 331b, and is transferred to the backplane. Thus, even if the first upper surface portion 331 including the first upper surface 331a and the second upper surface 331b is wider than the second upper surface portion 332, a width (or an area) of the layer 220R formed on the red sub-pixel R of the backplane may be approximately the same as that of the layer 220G formed on the green sub-pixel G.

According to a conventional method of manufacturing an organic light-emitting display apparatus, layers having the same thicknesses are simultaneously formed of an identical material on a red sub-pixel R and a green sub-pixel G, respectively, and then an additional layer is formed of the same material on the red sub-pixel R. Thus, layers are formed on the red sub-pixel R and the green sub-pixel G of the same material but with different thicknesses. In other words, according to the conventional method of manufacturing an organic light-emitting display apparatus, layer formation need to be performed twice to respectively form layers of the same material but different thicknesses on the red sub-pixel R and the green sub-pixel G.

However, in the method of manufacturing an organic light-emitting display apparatus according to the present embodiment, layers of the same material, but different thicknesses, may be formed on the red sub-pixel R and the green sub-pixel G, respectively, via a single process. Thus, according to the method of manufacturing an organic light-emitting display apparatus according to the present embodiment, manufacturing time may be reduced, and the organic light-emitting display apparatus may be manufactured simply and within a reduced manufacturing duration, thereby dramatically increasing manufacturing efficiency.

In particular, in order to increase light efficiency of the red sub-pixel R, the green sub-pixel G, and the blue sub-pixel B of an organic light-emitting display apparatus, a distance between a pixel electrode and an opposite electrode of each sub-pixel needs to be set according to the wavelength of light that is emitted from a pixel including the sub-pixel. For example, a distance between the pixel electrode 210G and the opposite electrode of the green sub-pixel G may need to be set longer than that between the pixel electrode 210B and the opposite electrode of the blue sub-pixel B, and a distance between the pixel electrode 210R and the opposite electrode of the red sub-pixel R may need to be set longer than that between the pixel electrode 210B and the opposite electrode of the blue sub-pixel B. In this case, no auxiliary layers are formed in the blue sub-pixel B, and auxiliary layers may be respectively formed of a material of a hole transport layer or the like in the green sub-pixel G and the red sub-pixel R such that the auxiliary layer formed in the red sub-pixel R is thicker than that formed in the green sub-pixel G. In the method of manufacturing an organic light-emitting display apparatus according to the present embodiment, the layers 220R of the red sub-pixel R and the layer 220G of the green sub-pixel G may be simultaneously formed to have different thicknesses, via a single process.

Although a considerable space exists between the donor mask 300 and the backplane also in FIG. 3 as described above with reference to FIG. 2, the is only an example for convenience of explanation, and the donor mask 300 and the backplane may be closer to each other, e.g., in contact or adhered. When a distance between the donor mask 300 and the backplane increases, even when only portions of the transfer layer 340 of the donor mask 300 that correspond to the transmittance areas TA1 and TA2 are evaporated, vaporized, or sublimated, the portions may be moved not only to the pixel electrode 210R of the red sub-pixel R and the pixel electrode 210G of the green sub-pixel G, but also to, e.g., the pixel electrode 210B of the blue sub-pixel B adjacent to the red sub-pixel R and the green sub-pixel G.

After this process is performed, a red emission layer, a green emission layer, and a blue emission layer may be respectively formed on the red sub-pixel R, the green sub-pixel G, and the blue sub-pixel B, and an opposite electrode that covers these emission layers and is a single body for a plurality of pixels may be formed, thereby manufacturing the organic light-emitting display apparatus.

The donor mask 300 of which the transfer layer 340 is partially transferred to the backplane may be re-used. In other words, after another transfer layer 340 is formed on the donor mask 300, the donor mask 300 may be aligned with another backplane, and then the other transfer layer 340 may be transferred to the other backplane.

In contrast with FIGS. 2-4, the donor mask 300 may further include a heat insulation layer (not shown, but see FIGS. 6 to 9) between the reflection layer 320 and the light-to-heat conversion layer 330. The heat insulation layer may prevent the heat generated in the light-to-heat conversion layer 330 from being transmitted to a portion of the transfer layer 340 on the blocking area BA of the reflection layer 320 via the reflection layer 320 and affecting the portion of the transfer layer 340. The heat insulation layer may be formed of a material having low thermal conductivity.

Figure 5:
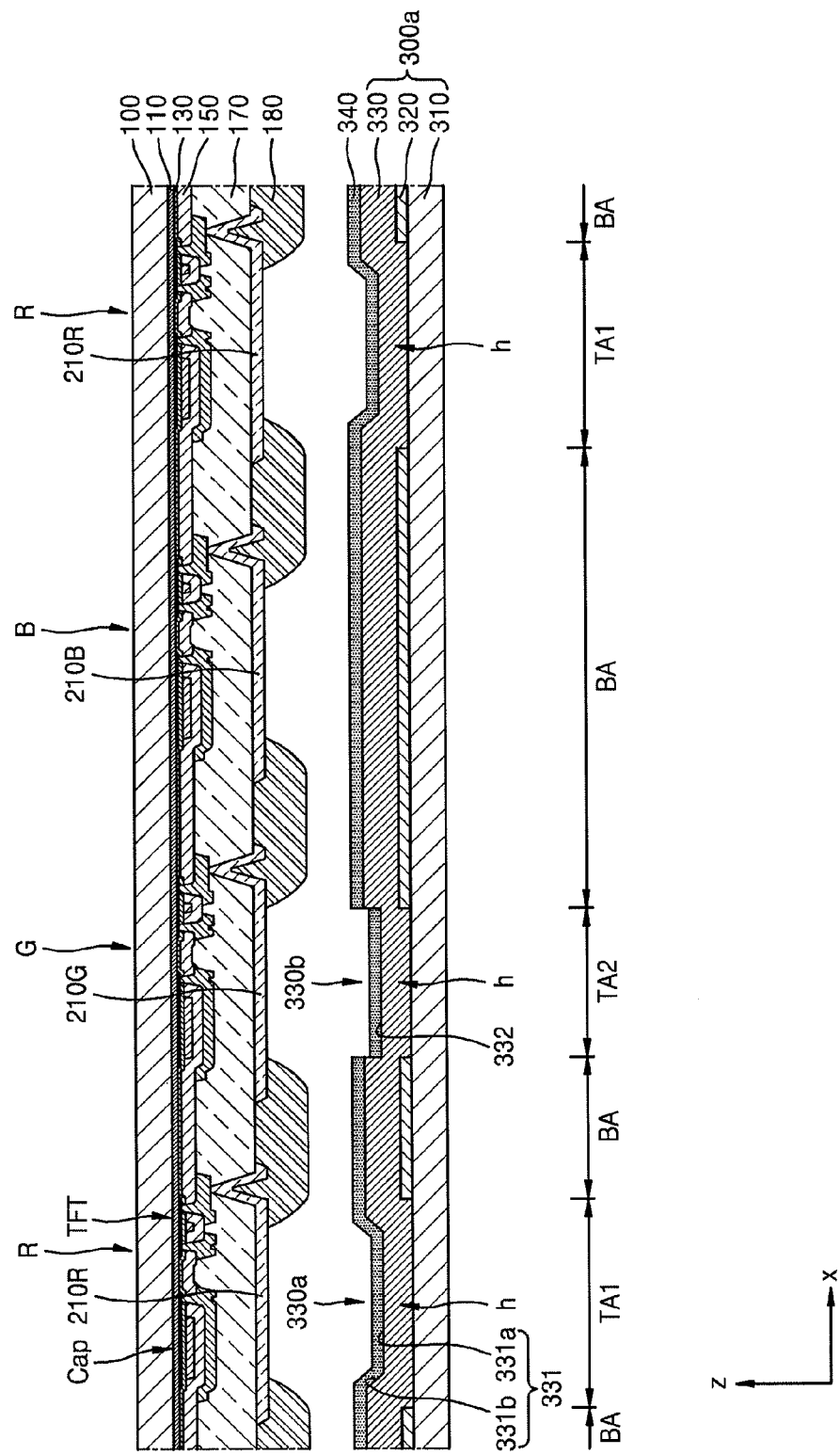
FIG. 5 illustrates a cross-sectional view of a stage in a method of manufacturing an organic light-emitting display apparatus, according to another embodiment.

FIG. 5 illustrates a cross-sectional view of a stage in a method of manufacturing an organic light-emitting display apparatus, according to another embodiment. In the method of manufacturing an organic light-emitting display apparatus according to the present embodiment, a donor mask 300a having a different shape from the donor mask 300 in the method of FIGS. 1-4 is used. In detail, as shown in FIG. 5, the light-to-heat conversion layer 330 may have a first concave portion 330a and a second concave portion 330b, and, as a first upper surface portion 331 is disposed in the first concave portion 330a, a second upper surface portion 332 may be disposed in the second concave portion 330b.

In this case, a first upper surface 331a of the first upper surface portion 331 is a lower surface of the first concave portion 330a, a second upper surface 331b of the first upper surface portion 331 is a lateral surface of the first concave portion 330a, and the second upper surface 332 has an upper surface that is a lower surface of the second concave portion 330b. As illustrated in FIG. 5, the lateral surface of the first concave portion 330a is inclined at an angle other than 90 degrees with respect to the lower surface of the first concave portion 330a, and a lateral surface of the second concave portion 330b is approximately perpendicular to the lower surface of the second concave portion 330b.

In the method of manufacturing an organic light-emitting display apparatus according to the present embodiment, a portion of the transfer layer 340 on the lower surface and the lateral surface of the first concave portion 330a corresponding to the first transmittance area TA1 of the reflection layer 320 is transferred to the pixel electrode 210R of the red sub-pixel R of the backplane, and a portion of the transfer layer 340 on the lower surface of the second concave portion 330b corresponding to the second transmittance area TA2 of the reflection layer 320 is transferred to the pixel electrode 210G of the green sub-pixel G of the backplane. Accordingly, the layer 220R of the red sub-pixel R, which is relatively thick, and the layer 220G of the green sub-pixel G, which is relatively thin, may be simultaneously formed.

In particular, since the lateral surface of the second concave portion 330b is perpendicular to the lower surface of the second concave portion 330b, a portion of the transfer layer 340 on the second upper surface portion 332 positioned on the lower surface of the second concave portion 330b propagate in an approximately +z direction without being dispersed in other directions, and thus a layer 220G having an accurate thickness may be formed. The portion of the transfer layer 340 that corresponds to the second transmittance area TA2 is placed within the second concave portion 330b so as to be separated from a portion of the transfer layer 340 that is placed outside the second concave portion 330b. Therefore, when the portion of the transfer layer 340 that corresponds to the second transmittance area TA2 is evaporated, vaporized, or sublimated and thus transferred to the backplane, since the portion of the transfer layer 340 is physically separated from the portion of the transfer layer 340 that exists outside the second concave portion 330b, undesired transferring of the portion of the transfer layer 340 existing outside the second concave portion 330b to the backplane may be effectively prevented or reduced.

Figure 6:
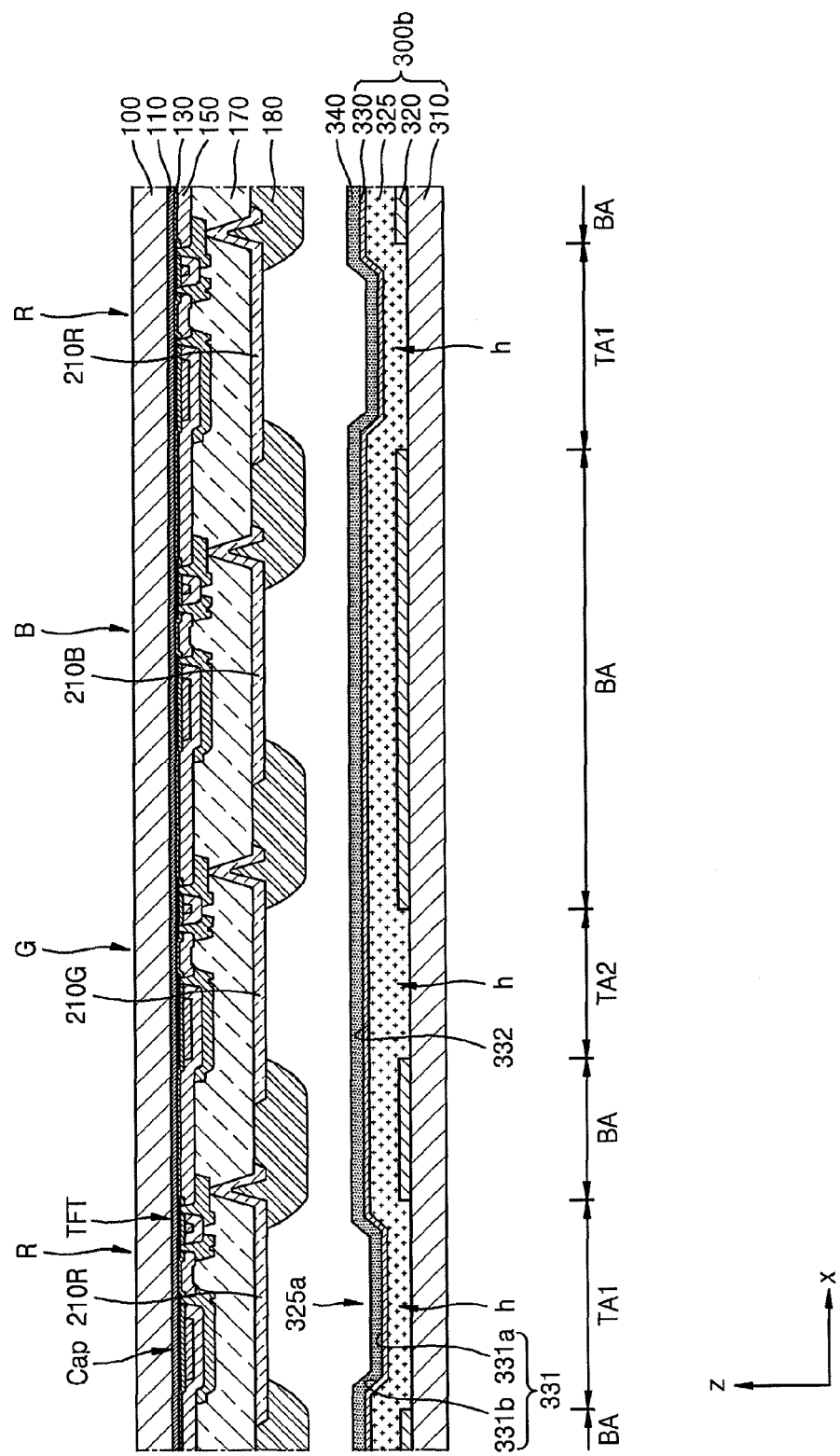
FIG. 6 illustrates a cross-sectional view of a stage in a method of manufacturing an organic light-emitting display apparatus, according to another embodiment.

FIG. 6 illustrates a cross-sectional view of a stage in a method of manufacturing an organic light-emitting display apparatus, according to another embodiment. In the method of manufacturing an organic light-emitting display apparatus according to the present embodiment, a donor mask 300b having a different shape from the donor mask 300 in the method of FIGS. 1-4 is used. In detail, as shown in FIG. 6, the donor mask 300b includes an insulation layer 325 interposed between the reflection layer 320 and the light-to-heat conversion layer 330. The insulation layer 325 includes a first concave portion 325a having a lower surface and a lateral surface inclined at an angle other than 90 degrees with respect to the lower surface, and the light-to-heat conversion layer 330 is formed on the insulation layer 325 to have an approximately uniform thickness. The insulation layer 325 may be, for example, the above-described heat insulation layer.

In this case, the light-to-heat conversion layer 330 may be formed along the curve of an upper surface of the insulation layer 325. Accordingly, when a portion of the light-to-heat conversion layer 330 that is within the first concave portion 325a of the insulation layer 325 is referred to as a first light-to-heat conversion layer and a portion of the light-to-heat conversion layer 330 that is outside the first concave portion 325a is referred to as a second light-to-heat conversion layer, the first light-to-heat conversion layer has the first upper surface portion 331 including the first upper surface 331a positioned on the lower surface of the first concave portion 325a and the second upper surface 331b positioned on the lateral surface of the first concave portion 325a, and the second light-to-heat conversion layer has the second upper surface portion 332 that is approximately parallel to the first upper surface 331a.

In the method of manufacturing an organic light-emitting display apparatus according to the present embodiment, since the light-to-heat conversion layer 330 is not patterned but the insulation layer 325 is patterned in the donor mask 300b, the donor mask 300 may be more easily manufactured, and thus the overall manufacturing costs may be reduced. In particular, since the insulation layer 325 is able to be formed of a material such as silicon oxide or silicon nitride, the insulation layer 325 may be easily patterned using a photoresist or the like when being formed of this material, and consequently the donor mask 300b may be more easily manufactured.

Figure 7:
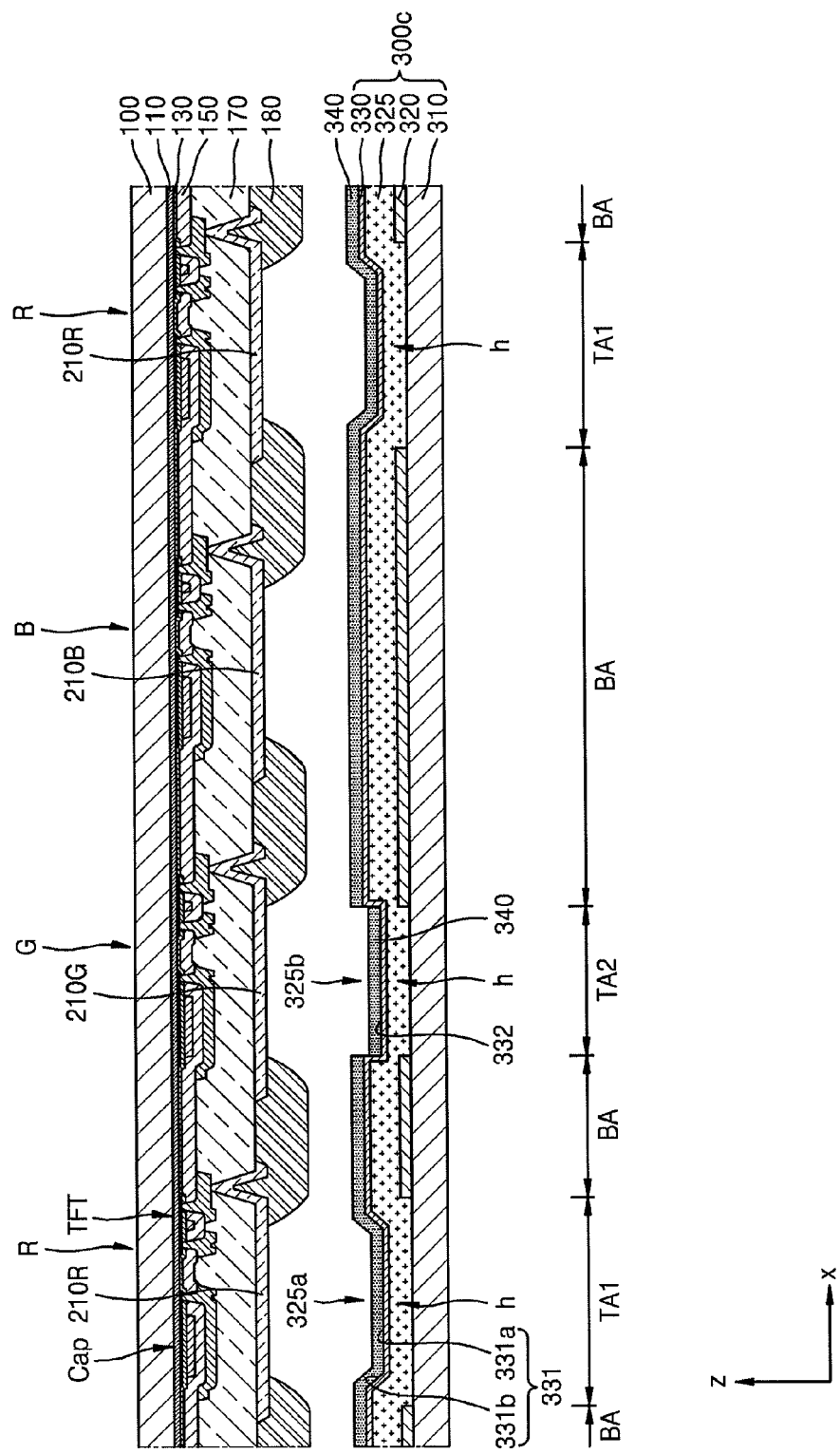
FIG. 7 illustrates a cross-sectional view of a stage in a method of manufacturing an organic light-emitting display apparatus, according to another embodiment.

As shown in FIG. 7, which is a cross-sectional view schematically of a stage in a method of manufacturing an organic light-emitting display apparatus according to another embodiment, an insulation layer 325 of a donor mask 300c may further have a second concave portion 325b in addition to the first concave portion 325a.

In this case, the second concave portion 325*b* may have a lower surface and a lateral surface approximately perpendicular to the lower surface. Accordingly, the second light-to-heat conversion layer may be positioned within the second concave portion 325*b* so that the upper surface of the second upper surface portion 332 is the lower surface of the second concave portion 325*b*.

Furthermore, as shown in FIG. 7, since the second concave portion 325*b* may have the lower surface and the lateral surface approximately perpendicular to the lower surface, the second light-to-heat conversion layer may be positioned only within the second concave portion 325*b* and may be physically separated from a portion of the light-to-heat conversion layer 330 positioned outside the second concave portion 325*b*. In this case, heat generated in the second light-to-heat conversion layer by lamp light or a laser beam reaching the second light-to-heat conversion layer via the second transmittance area TA2 of the reflection layer 320 may be effectively prevented from being directly transferred to other portions of the light-to-heat conversion layer 330. As a result, a portion of the transfer layer 340, that does not correspond to the second transmittance area TA2, but is adjacent to the portion corresponding to the second transmittance area TA2, may be effectively prevented from being transferred to the backplane.

Figure 8:
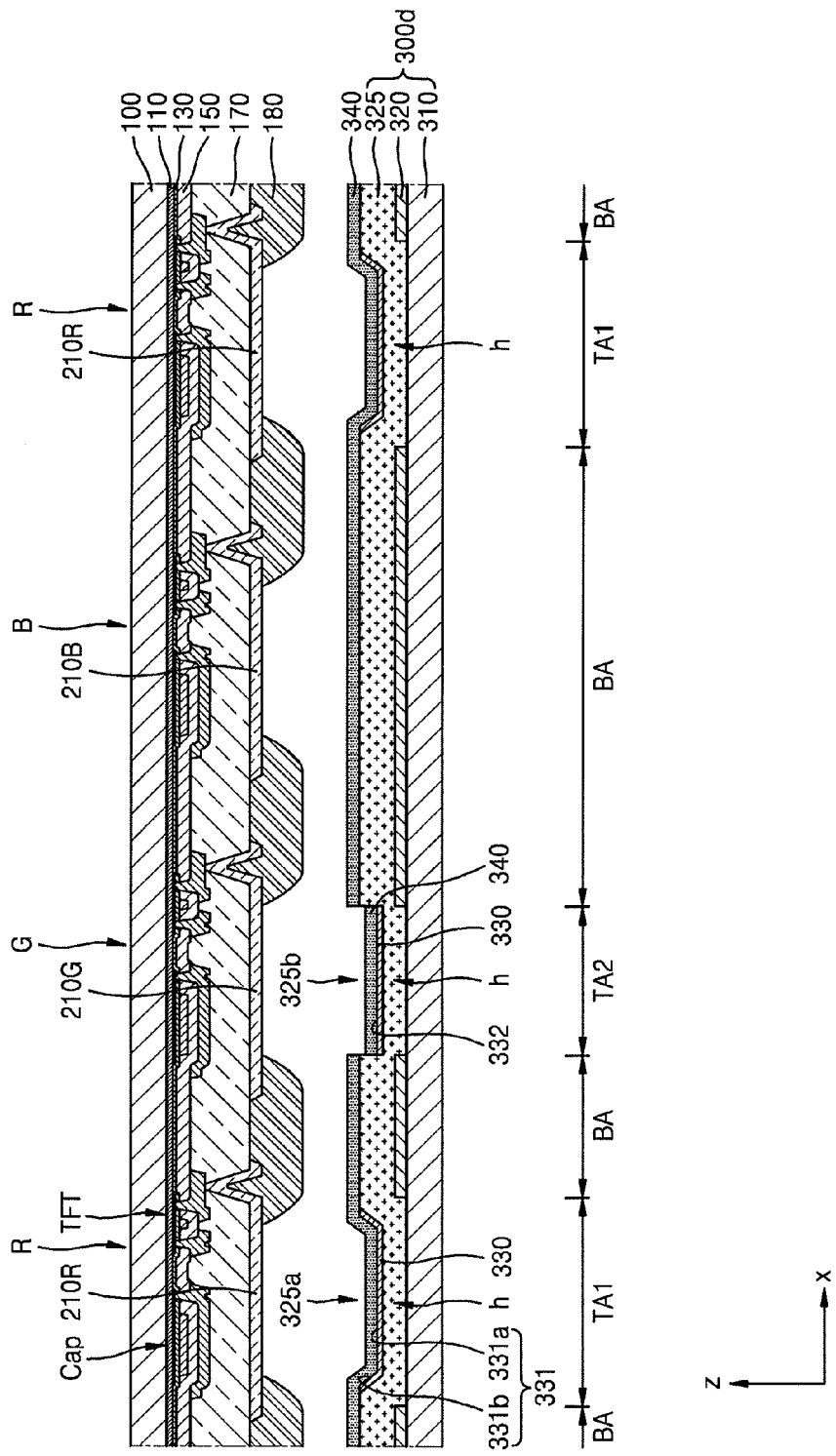
FIG. 8 illustrates a cross-sectional view of a stage in a method of manufacturing an organic light-emitting display apparatus, according to another embodiment.

Alternatively, as shown in FIG. 8, which is a cross-sectional view of a stage in a method of manufacturing an organic light-emitting display apparatus according to another embodiment, a light-to-heat conversion layer 330 of a donor mask 300*d* may be patterned. In other words, the light-to-heat conversion layer 330 may be formed only within the first and second concave portions 325*a* and 325*b* of the insulation layer 325. Accordingly, only portions of the transfer layer 340 respectively corresponding to only the first and second concave portions 325*a* and 325*b* of the insulation layer 325 may be effectively transferred to the backplane by the heat generated in the light-to-heat conversion layer 330, because the other portion of the transfer layer 340 does not directly contact the light-to-heat conversion layer 330. Thus, transferring of the other portion of the transfer layer 340 to the backplane may be prevented or the amount of a portion of the transfer layer 340 transferred may be reduced.

Figure 9:
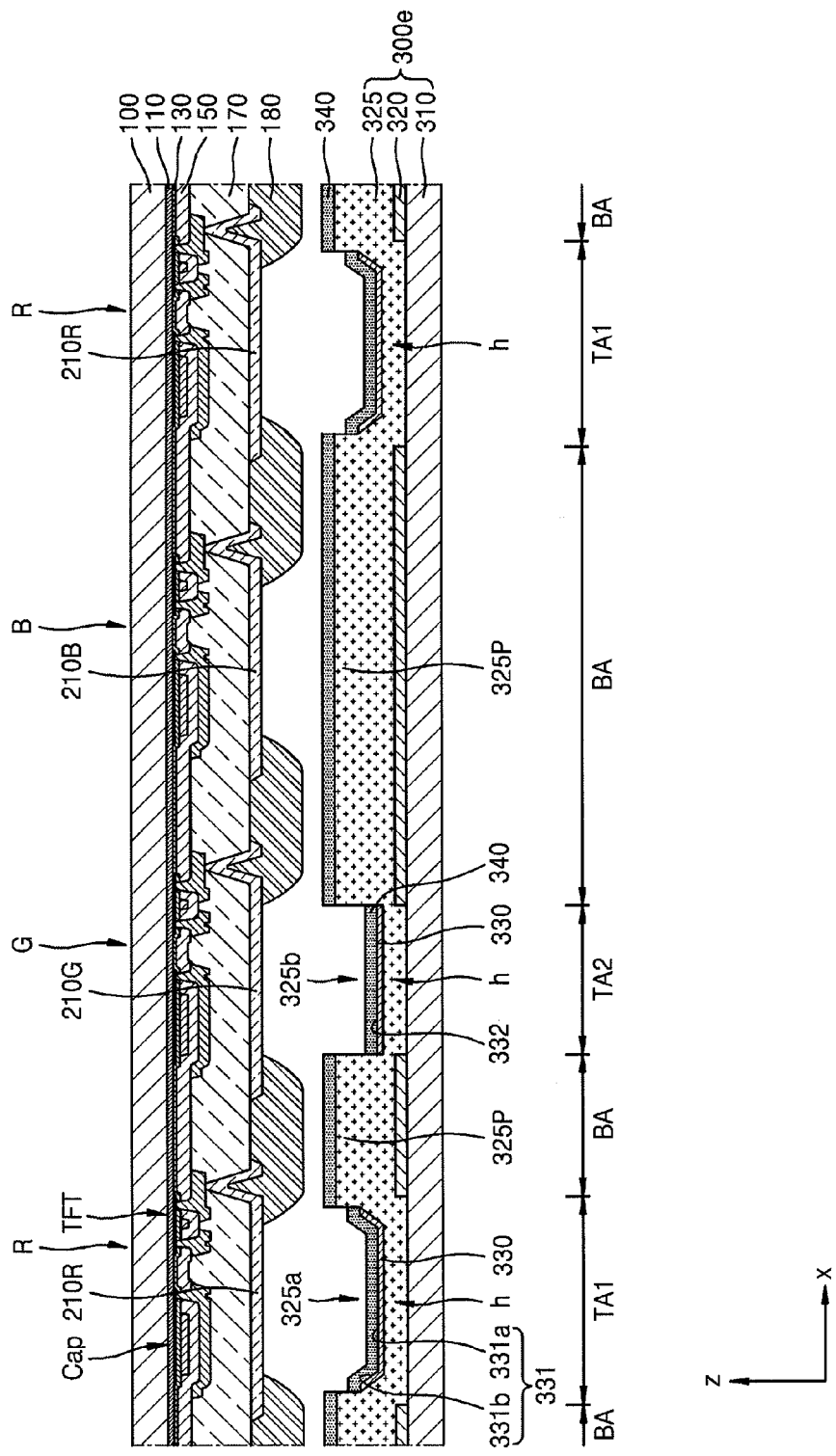
FIG. 9 illustrates a cross-sectional view of a stage in a method of manufacturing an organic light-emitting display apparatus, according to another embodiment.

As shown in FIG. 9, which is a cross-sectional view of a stage in a method of manufacturing an organic light-emitting display apparatus according to another embodiment, an insulation layer 325 of a donor mask 300*e* may further include a protrusion 325P positioned between the first concave portion 325*a* and the second concave portion 325*b*. Accordingly, a portion of the transfer layer 340 corresponding to the first concave portion 325*a* may be prevented from being transferred to other sub-pixels than the red sub-pixel R of the backplane, and a portion of the transfer layer 340 corresponding to the second concave portion 325*b* may be prevented from being transferred to other sub-pixels than the green sub-pixel G of the backplane.

Although only a method of manufacturing an organic light-emitting display apparatus has been described above, embodiments are not limited thereto. The donor mask 300 used in such a method of manufacturing other types of displays belongs to the scope of the present disclosure.

The donor mask 300 according to an embodiment may include the base substrate 310, the reflection layer 320, and the light-to-heat conversion layer 330 as shown in FIGS. 2-4. In some cases, the transfer layer 340 capable of being formed on the light-to-heat conversion layer 330 via a deposition or the like may be considered as a portion of the donor mask 300. Since the donor masks 300*a* to 300*e* of FIGS. 5 to 9 may employ the structures used in the above-described methods of manufacturing an organic light-emitting display apparatus or modifications of the structures, a description thereof will be omitted.

According to embodiments as described above, a donor mask capable of simplifying the manufacturing process of an organic light-emitting display apparatus and a method of manufacturing an organic light-emitting display apparatus using the donor mask may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display apparatus, the method comprising:

preparing a substrate on which a plurality of pixel electrodes are formed;

preparing a donor mask, the donor mask comprising:

a base substrate;

a light-to-heat conversion layer on the base substrate and including a first upper surface portion and a second upper surface portion, the first upper surface portion including a first upper surface and a second upper surface, the second upper surface being connected to the first upper surface and inclined at an angle other than 90 degrees with respect to the first upper surface; and a reflection layer between the base substrate and the light-to-heat conversion layer, the reflection layer including through holes corresponding to the first upper surface portion and the second upper surface portion;

forming a transfer layer on the light-to-heat conversion layer of the donor mask;

aligning the substrate and the donor mask to each other; and transferring portions of the transfer layer of the donor mask that correspond to the through holes onto the plurality of pixel electrodes on the substrate, such that a layer formed on pixel electrodes of first color pixels is thicker than a layer formed on pixel electrodes of second color pixels.

2. The method as claimed in claim 1, wherein transferring includes:

transferring a portion of the transfer layer on the first upper surface portion onto the pixel electrodes of the first color pixels formed on the substrate; and transferring a portion of the transfer layer on the second upper surface portion onto the pixel electrodes of the second color pixels formed on the substrate.

3. A method of manufacturing an organic light-emitting display apparatus, the method comprising:
- preparing a substrate on which a plurality of pixel electrodes are formed;
- preparing a donor mask,
  - the donor mask comprising:
    - a base substrate;
    - a light-to-heat conversion layer on the base substrate and including a first upper surface portion and a second upper surface portion, the first upper surface portion including a first upper surface and a second upper surface, the second upper surface being connected to the first upper surface and inclined at an angle other than 90 degrees with respect to the first upper surface; and
    - a reflection layer between the base substrate and the light-to-heat conversion layer, the reflection layer including through holes corresponding to the first upper surface portion and the second upper surface portion;
- forming a transfer layer on the light-to-heat conversion layer of the donor mask;
- aligning the substrate and the donor mask to each other; and
- transferring portions of the transfer layer of the donor mask that correspond to the through holes onto the plurality of pixel electrodes on the substrate;
- wherein transferring includes:
- transferring a portion of the transfer layer on the first upper surface portion onto pixel electrodes of first color pixels formed on the substrate;
- transferring a portion of the transfer layer on the second upper surface portion onto pixel electrodes of second color pixels formed on the substrate such that a layer formed on the pixel electrodes of the first color pixels is thicker than a layer formed on the pixel electrodes of the second color pixels.

4. The method as claimed in claim 3, wherein transferring includes simultaneously transferring the portion of the transfer layer on the first upper surface portion and the portion of the transfer layer on the second upper surface portion onto the pixel electrodes of the first color pixels and the pixel electrodes of the second color pixels, respectively.

5. The method as claimed in claim 3, wherein the second upper surface portion has an upper surface that is parallel to the first upper surface.

6. The method as claimed in claim 3, wherein a lower surface portion of the light-to-heat conversion layer that corresponds to the first upper surface portion of the light-to-heat conversion layer is on a same plane as a lower surface portion of the light-to-heat conversion layer that corresponds to the second upper surface portion of the light-to-heat conversion layer.

7. The method as claimed in claim 3, wherein the light-to-heat conversion layer has a first concave portion and a second concave portion, the first upper surface portion being in the first concave portion, and the second upper surface portion being in the second concave portion.

8. The method as claimed in claim 7, wherein the first upper surface is a lower surface of the first concave portion, the second upper surface is a lateral surface of the first concave portion, the second upper surface portion has an upper surface that is a lower surface of the second concave portion, and a lateral surface of the second concave portion is perpendicular to the lower surface of the second concave portion.

9. The method as claimed in claim 3, wherein
- the donor mask further includes an insulation layer between the reflection layer and the light-to-heat conversion layer, the insulation layer including a first concave portion having a lower surface and a lateral surface inclined at an angle other than 90 degrees with respect to the lower surface, and
- the light-to-heat conversion layer includes a first light-to-heat conversion layer within the first concave portion and a second light-to-heat conversion layer outside the first concave portion, wherein the first light-to-heat conversion layer includes a first upper surface portion, the first upper surface is positioned at the lower surface of the first concave portion, the second upper surface is positioned at the lateral surface of the first concave portion, and the second light-to-heat conversion layer includes a second upper surface portion.

10. The method as claimed in claim 9, wherein the insulation layer further includes a second concave portion separated from the first concave portion, the insulation layer including a lower surface and a lateral surface perpendicular to the lower surface, the second light-to-heat conversion layer is within the second concave portion, and an upper surface of the second upper surface portion is at the lower surface of the second concave portion.

11. The method as claimed in claim 10, wherein the insulation layer further includes a protrusion between the first concave portion and the second concave portion.

* * * * *